US007556978B2

(12) United States Patent
Liu

(10) Patent No.: US 7,556,978 B2
(45) Date of Patent: Jul. 7, 2009

(54) PIEZOELECTRIC MEMS SWITCHES AND METHODS OF MAKING

(75) Inventor: Lianjun Liu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 320 days.

(21) Appl. No.: 11/363,791

(22) Filed: Feb. 28, 2006

(65) Prior Publication Data

US 2007/0202626 A1 Aug. 30, 2007

(51) Int. Cl.
*H01L 21/00* (2006.01)

(52) U.S. Cl. ............................ 438/48; 438/50; 438/52; 257/E27.006

(58) Field of Classification Search .................. 438/50, 438/52, 48; 257/21.643, E29.324, E27.006; 333/262
See application file for complete search history.

(56) References Cited

U.S. PATENT DOCUMENTS 5,004,555 A * 4/1991 Cheng et al. ............ 252/62.9 R
5,578,976 A * 11/1996 Yao ............................ 333/262
5,638,946 A * 6/1997 Zavracky .................... 200/181
5,938,612 A 8/1999 Kline-Schoder et al.
6,046,659 A * 4/2000 Loo et al. ................... 333/262
6,060,336 A 5/2000 Wan
6,706,548 B2 3/2004 Liu
6,794,101 B2 9/2004 Liu et al.
7,119,440 B2 * 10/2006 Huang ........................ 257/751
7,215,064 B2 * 5/2007 Mehta ........................ 310/331
2003/0020173 A1 * 1/2003 Huff et al. .................. 257/774
2003/0127698 A1 7/2003 Lee
2004/0094815 A1 5/2004 Park
2005/0151444 A1 7/2005 Mehta
2005/0237127 A1 10/2005 Van Delden

OTHER PUBLICATIONS

"Pyroelectricity," J. Webster (ed.), Wiley Encyclopedia of Electrical and Electronics Engineering, 1999, John Wiley & Sons, Inc.*
"Piezoelectricity," J. Webster (ed.), Wiley Encyclopedia of Electrical and Electronics Engineering, 1999, John Wiley & Sons, Inc.*
International Search Report and Written Opinion.

* cited by examiner

*Primary Examiner*—Alexander G Ghyka
*Assistant Examiner*—Leonard Chang
(74) *Attorney, Agent, or Firm*—Ingrassia, Fisher & Lorenz, P.C.

(57) ABSTRACT

MEMS piezoelectric switches 100 that provide advantages of compact structure ease of fabrication in a single unit, and that are free of high temperature-induced morphological changes of the contact materials and resultant adverse effects on properties. High temperature-induced morphological changes refer to changes that occur during fabrication when metallic contacts such as radio frequency lines 125, 130 and shorting bars 150 are exposed to temperatures required to anneal a piezoelectric layer or those temperatures encountered during high temperature deposition of the piezoelectric layer, if such process is used instead.

18 Claims, 4 Drawing Sheets

PIEZOELECTRIC MEMS SWITCHES AND METHODS OF MAKING

TECHNICAL FIELD

The present invention relates generally to semiconductor switches. More particularly, the present invention relates to piezoelectric MEMS switches.

BACKGROUND

It is becoming increasingly common to use Micro-Electro-Mechanical Systems, abbreviated as "MEMS" in a variety of applications. MEMS are micro-sized mechanical devices that are built onto semiconductor chips. In the research labs since the 1980s, MEMS devices began to materialize as commercial products in the mid-1990s. They are used to make pressure, temperature, chemical and vibration sensors, light reflectors and switches as well as accelerometers for airbags, vehicle control, pacemakers and games. The technology is also used to make ink jet print heads, micro-actuators for read/write heads and all-optical switches that reflect light beams to the appropriate output port.

MEMS are often used in conjunction with devices that utilize a piezoelectric component coupled to a pair of electrodes to actuate a switch. In general, during the fabrication of a piezoelectric MEMS switch, the switch undergoes heating to high temperatures (in excess of about 550 Centigrade, and often 660-700 Centigrade) as the piezoelectric component is annealed, or deposited if high temperature deposition is used. These high temperatures significantly degrade the morphology of metallic switch components such as switch contacts and adversely affect their electrical properties.

Attempts have been made to avoid subjecting the metallic components of the MEMS switch to high temperatures. For example, U.S. patent publication number 2004-94815 shows a bulky switch produced by preparing each of the two contacts of the switch on a separate wafer after any high temperature processes. The wafers are then stacked so that the contacts register and form the switch. The method results in a bulky switch that is costly to manufacture.

In a more typical design, such as that shown in U.S. patent publication number 2005-0151444, the MEMS switch is fabricated on a single wafer and metallic contacts are subjected to high temperatures during a piezoelectric annealing step. The publication shows a MEMS switch using multilayer piezoelectric (PZT) film. It uses PECVD $SiO_2$ as a sacrificial layer that is removed by wet etching.

Accordingly, it is desirable to develop a method of making a MEMS switch that does not subject metal components of the switch to annealing temperatures. In addition, it is desirable to maintain the compact size of the switch and to avoid the use of multiple wafers to build each contact of the switch separately. Furthermore, other desirable features and characteristics of the present disclosure will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, which are schematic, not to scale and intended for illustrative purposes. Like reference numbers refer to similar elements throughout the figures.

DETAILED DESCRIPTION

Figure 1:
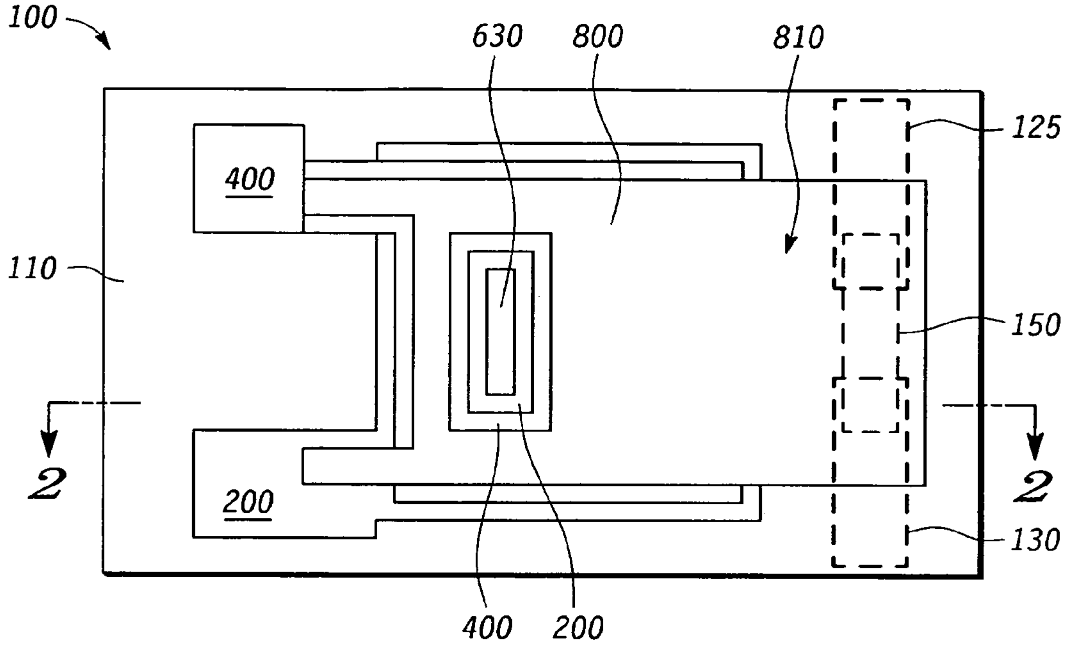
FIG. 1 is a top view of an embodiment of a piezoelectric MEMS switch in accordance with the present disclosure.

The following detailed description is merely illustrative in nature and is not intended to limit the present disclosed technology or the application and uses of the technology. Furthermore, there is no intention to be bound by any expressed or implied theory presented in the preceding technical field, background, brief summary or the following detailed description.

The MEMS piezoelectric switches of the present disclosure provide advantages of compact structure, ease of fabrication in a single unit, and are free of high temperature-induced morphological changes of the electrode materials. The term "high temperature-induced" morphological changes means changes that occur during fabrication when metallic contacts such as radio frequency lines and shorting bars are exposed to temperatures required to anneal a piezoelectric layer or those temperatures encountered during high temperature deposition of the piezoelectric layer, if such process is used instead. Typically, these temperatures are in the range from about 550 to about 700 centigrade. High temperature-induced morphological changes include, but are not limited to, roughening of exposed surfaces of the contacts and structural changes in the metals that adversely affect electrical properties, such as conductivity, resistance, and the like. The switches of the present disclosure may be fabricated by building upon a single base substrate using methods that include a sacrificial layer, suitably silicon dioxide, polysilicon, silicon-oxynitride, or the like. In addition, polymer materials such as polyimide, BCB, and the like are used selectively to create structure and to hold components of the switch together as a unitary device. As will become apparent from the disclosure below, the polymer and sacrificial layer selection should be such that the sacrificial layer is removable by a technique that does not significantly affect the polymer, which must protect other components while the sacrificial layer is removed.

The present disclosure may be more readily appreciated by considering the figures that represent an example of the embodiments of the disclosure.

As a preliminary matter, the terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

Further, the terms "left," "right," "front," "back," "top," "bottom," "over," "under," in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

Figure 2:
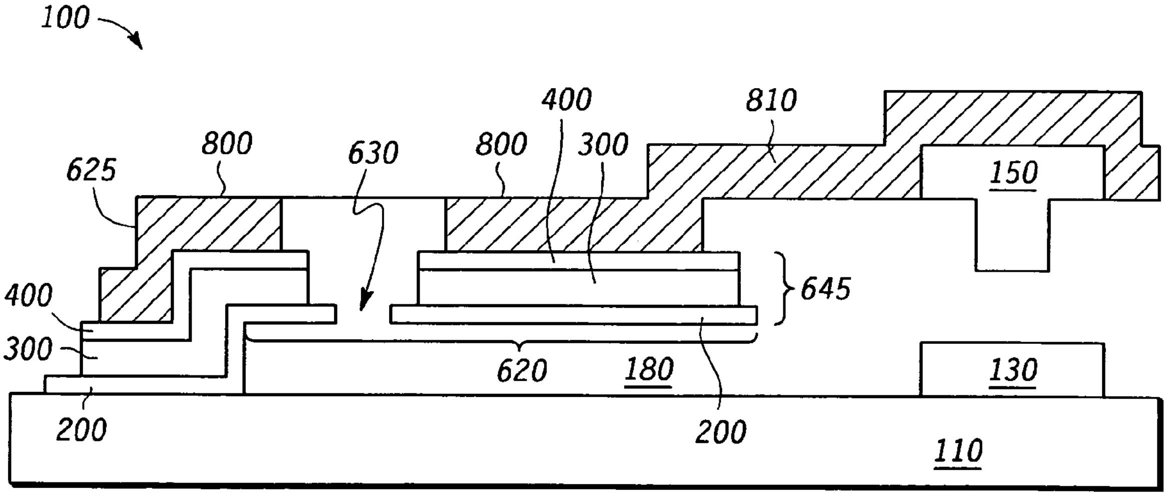
FIG. 2 is a cross sectional view of the embodiment of FIG. 1.

FIGS. 1 and 2 depict top and cross section views respectively of a piezoelectric MEMS switch of this disclosure. The switch 100 is fabricated onto a base substrate 110. The switch includes a pair of contacts, shown as RF lines 125 (input) and 130 (output) laid down on the substrate 110, with shorting bar 150 poised above the RF lines, in the open switch shown. The shorting bar 150 is formed in and supported by a boom 810 which is part of upper dielectric layer 800 that mechanically links the shorting bar to a cantilever 620. In the illustrated embodiment, the upper dielectric layer 800 covers almost the entire upper surface of the device to add strength. Other embodiments may use less dielectric and only cover selected areas.

As shown the cantilever 620 has one end 625 anchored to the substrate 110, and the larger portion of its structure is suspended and spaced from substrate 110. This separating space 180, as explained below, contained sacrificial material in initial fabrication stages.

The cantilever 620 has a layered structure including a pair of electrode layers 200, 400 between which is sandwiched a piezoelectric layer 300. Bending movement of the cantilever 620 is induced by the actuator formed by electrode layers 200 and 400 and the piezoelectric layer 300. The cantilever 620 is flexible and when bending, its outer end 645 can move up and down (reciprocate) while the cantilever is held fixed at opposite end 625. This reciprocation moves the shorting bar 150 down into electrical communication with the RF lines 125, 130. When not actuated, the cantilever 620 is in the relaxed position, i.e. horizontal position based on the orientation of the figures. The cantilever 620 has a through-hole 630 shown here as rectangular, but other shapes are also useful. The through-hole extends to the space 180 below the cantilever 620 from which sacrificial material was removed via the through-hole 630, as explained below. Mechanically, the through-hole 630 also may assist in the flexing of the cantilever 620.

Figure 3:
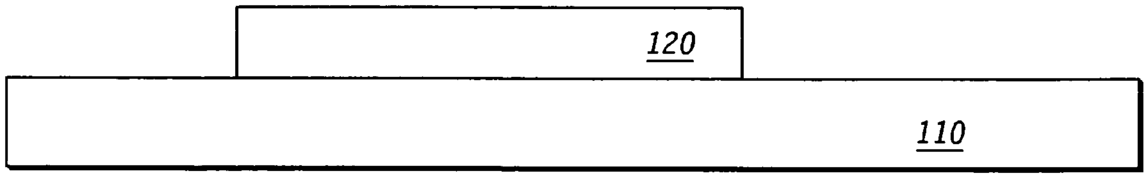
FIGS. 3-12 illustrate stages in an example of a method of fabricating the switch of FIG. 1.

FIGS. 3-8 depict stages of an example of a method of fabricating the switch of FIGS. 2 and 3. Referring to FIG. 3, a sacrificial layer 120 is formed on base substrate 110. The sacrificial layer may be made from silicon dioxide, polysilicon, silicon oxynitride, and the like. Forming the layer 120 may be through any conventional or yet to be disclosed process, and may include deposition, patterning by photolithography and etching, for example.

Figure 4:
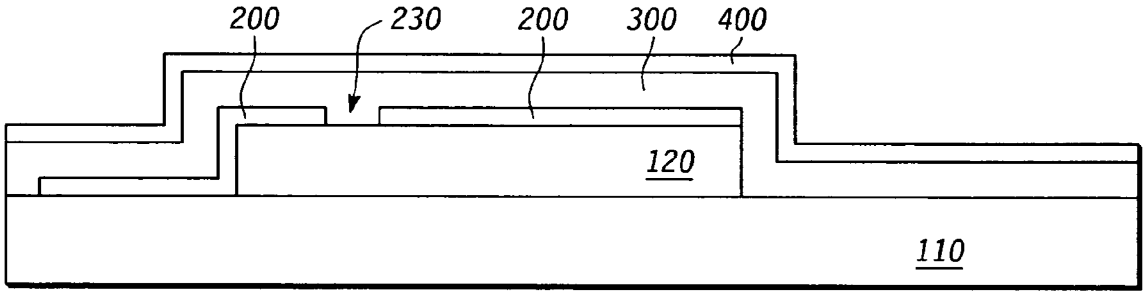

In FIG. 4 a first electrode layer 200 is formed over layer 120. The electrode layer may be any suitable high electrical conductivity material that is not affected by high temperatures or not significantly affected, such as platinum. The layer may be deposited by any known technique, or yet to be developed technique, that is suitable. Likewise, it may be patterned by known or yet to be developed techniques, for example photolithography and HF acid etching. Note that the patterning and etching creates a through-hole 230 in electrode layer 200 that will ultimately extend through all layers formed as through-hole 630 shown in FIGS. 1 and 2. The through-hole will be used to remove layer 120, as explained below to create the cantilever 620.

A piezoelectric layer 300 is formed conformally over the patterned electrode layer 200. This layer 300 may be deposited at high temperatures so that it is annealed as deposited. Alternatively, it may be deposited and then annealed. In either case, the device created thus far will be subject to high temperatures. In accordance with this disclosure, there are no metallic contacts yet created that might be adversely affected by high temperatures. The piezoelectric layer may be of any suitable piezoelectric material, such as PZT, BST, AlN, ZnO, and the like A second electrode 400 is formed over the piezoelectric layer to complete the layered piezoelectric actuator.

Figure 5:
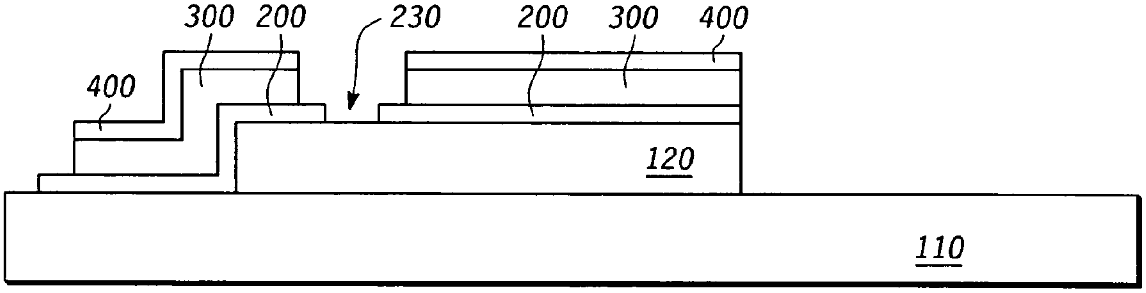

In FIG. 5, the second electrode 400 and the piezoelectric layer 300 are patterned. Note that the patterning creates an extension of the through-hole 230 to layer 120. If necessary, the piezoelectric layer may now be polarized, by heating and applying a voltage across it, as is well known.

Figure 6:
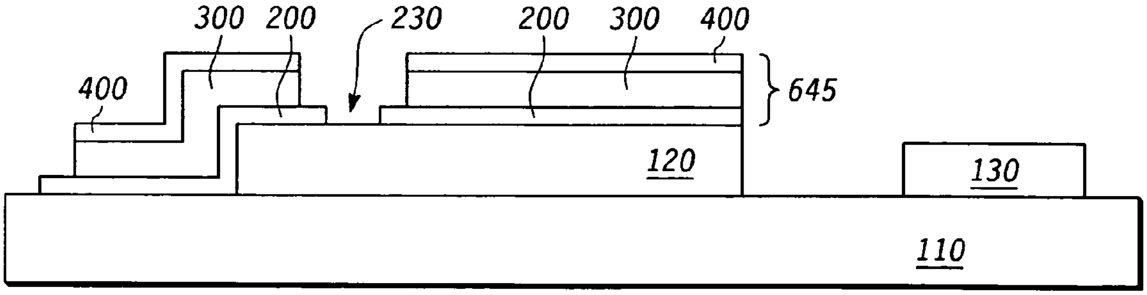

In FIG. 6, the RF lines 125 (not shown), 130 are deposited and patterned. These lines are adjacent to the stacked electrodes 200, 400 and piezoelectric layer 300, and spaced from the terminal end 645 of the stack. In the embodiment shown, they are deposited onto the substrate 110, although they may also be laid down on another layer(s) on the substrate 110.

Figure 7:
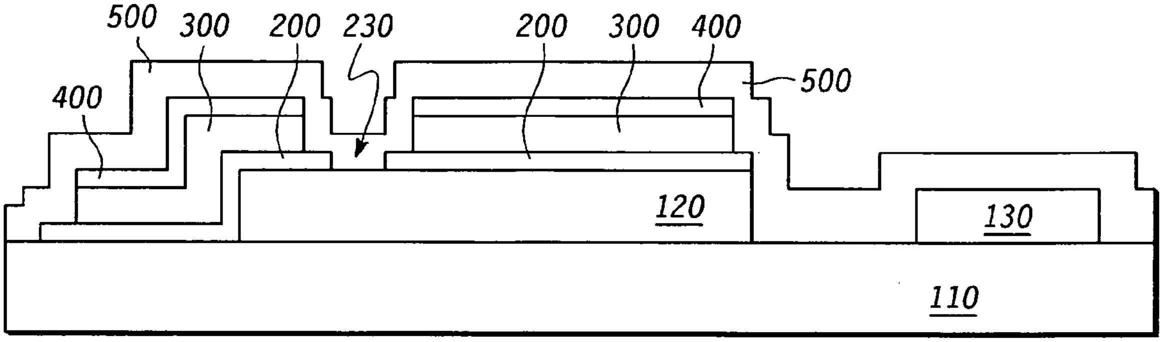
Figure 8:
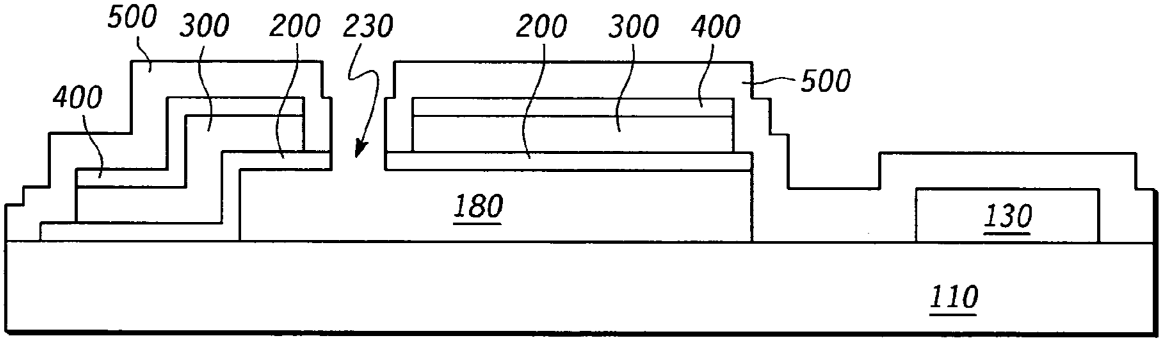

In FIG. 7, the structure of FIG. 6 is covered with a conformal polymer coating 500. The polymer coating may be of polyimide, BCB, and the like. In FIG. 8, the polymer coating 500 is patterned to remove the polymer covering through-hole 230 by any suitable technique, such as oxygen plasma. Once the through-hole 230 is free of polymer shielding, as in FIG. 8, an etching technique, for example wet HF acid etching, is used to remove the sacrificial layer 120.

Figure 9:
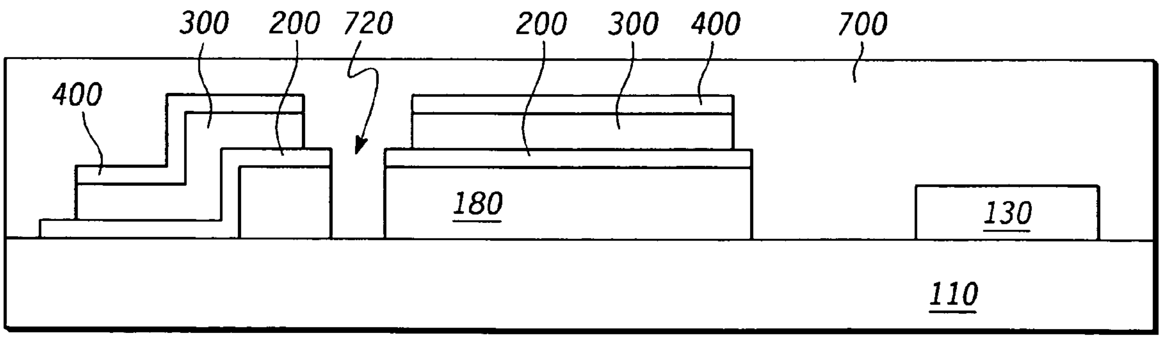

In FIG. 9, a second polymer coating 700 is applied. Note that the coating has a finger 720 that extends into the through-hole 230 and into the space 180 previously occupied by the sacrificial layer 120. The finger 720 provides some support to the structure.

Figure 10:
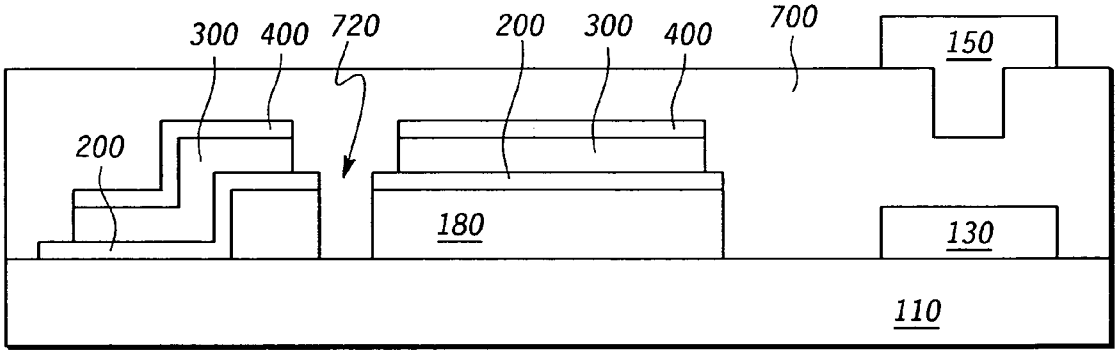

IN FIG. 10, The second polymer coating 700 is patterned to form a recess to accept a contact, such as shorting bar 150. The shorting bar 150 is then deposited using any suitable metal deposition technique, and patterned, as shown.

Figure 11:
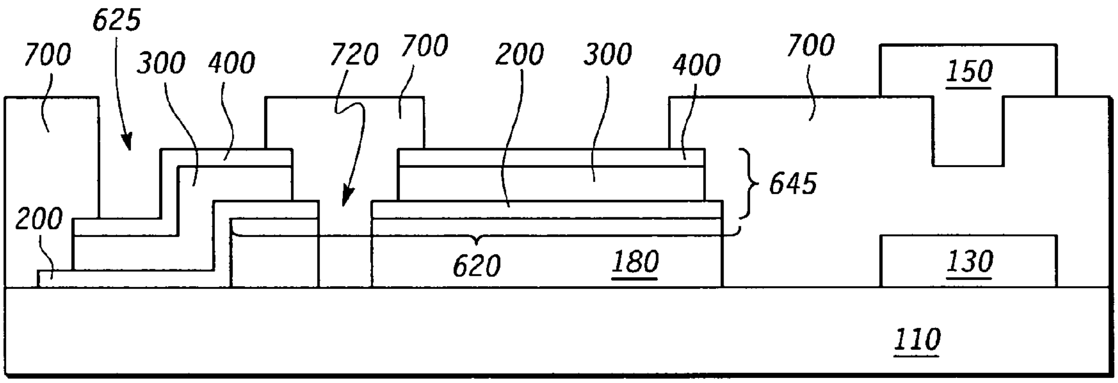
Figure 12:
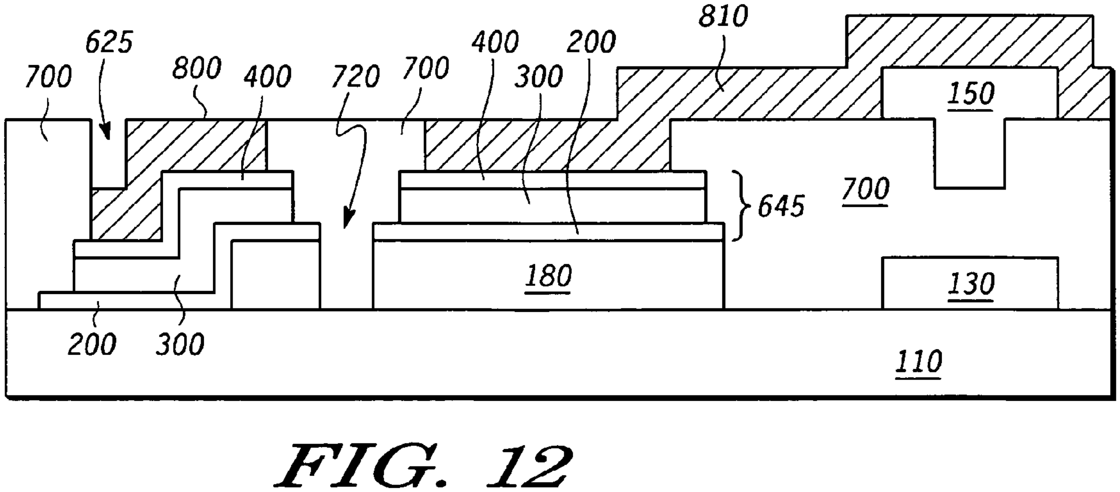

In FIG. 11, the polymer coating 700 is patterned to remove some of it to expose cantilever 620 (i.e. to expose a portion of cantilever 620). In FIG. 12, a dielectric is formed over exposed (not covered by polymer) cantilever surfaces. This creates a boom 810 that mechanically links the shorting bar 150 to the cantilever 620. It also provides some structural reinforcement of the cantilever 620 at its fixed end 645, connected to the substrate 110, as shown. The dielectric layer may be of silicon dioxide, silicon nitride, and the like.

The polymer coating 700 of FIG. 12 is removed to form the completed MEMS switch shown in FIG. 2, discussed above. Removal may be by any known or yet to be developed technique, such as a dry removal process, such as oxygen plasma.

In summary, the present disclosure is of MEMS devices that are free of high temperature-induced morphological changes in contacts, that can be formed on a single substrate, and that are made in a process requiring removal of a sacrificial layer. During the forming of the devices, a polymer layer holds a flexible cantilever and a spaced-apart shorting bar in place until a dielectric material is deposited to link the shorting bar to the cantilever.

The present disclosure includes methods of making a piezoelectric MEMS switch that includes forming a sacrificial layer on a substrate. The sacrificial layer may be silicon oxide, silicon oxynitride or polysilicon. It also includes forming a first electrode layer. The forming of the first electrode layer may include depositing a metallic composition and patterning the first electrode. The method includes forming an annealed piezoelectric dielectric material layer. The forming of the annealed layer may include depositing, at high temperatures, a piezoelectric dielectric material in a layer. The forming of the annealed layer may otherwise include depositing a piezoelectric dielectric material layer and annealing the layer at high temperatures. The method may also include polarizing the piezoelectric layer by applying heat and voltage across the piezoelectric layer. The method further includes forming a second electrode layer. Forming the second electrode may include depositing a metallic composition and patterning the second electrode. Radio frequency signal lines are formed adjacent the first and second electrodes, without subjecting the lines to high temperatures in processes after forming the lines. In addition, the method includes forming a first polymer coat and removing the sacrificial layer. The removing of the sacrificial layer may include patterning and etching the first polymer coat to form a through-hole in it and wet etching removal of sacrificial material through the through-hole. A second polymer coat is formed and a contact is formed in the second polymer coat. The second polymer coat is patterned. A patterned dielectric layer is formed to link a cantilever, formed of layers of the first electrode, the second electrode and the piezoelectric layer, to the contact. The second polymer coat is removed. The first and second polymer coats each may be any one of polyimide, or BCB.

The present disclosure also provides a method of making a piezoelectric MEMS switch that includes forming sacrificial layer on a substrate; forming a first electrode layer; and forming an annealed piezoelectric dielectric material layer. The forming of the annealed piezoelectric layer may include depositing, at high temperatures, a piezoelectric dielectric material in a layer. Alternatively, the forming of the annealed piezoelectric layer may include depositing a piezoelectric dielectric material layer and annealing the layer at high temperatures. The method further includes forming a second electrode layer; forming radio frequency signal lines adjacent the first and second electrodes after the forming and after subjecting to high temperatures of the piezoelectric material; forming a first polymer coat; removing the sacrificial layer; forming a second polymer coat; forming a contact in the second polymer coat after the forming and subjecting to high temperatures of a piezoelectric material; patterning the second polymer coat; and forming a patterned dielectric layer so that a portion of the formed dielectric layer connects an underlying cantilever to the contact; and removing the patterned second polymer coat.

The above method optionally includes applying heat and voltage across the piezoelectric layer to polarize the layer. Further, the removing of the sacrificial layer may include patterning and etching the first polymer coat to provide access to the sacrificial layer via a through-hole in the first polymer coat; and wet etching removal of sacrificial layer material through the through-hole. The sacrificial layer may be silicon oxide, silicon oxynitride or polysilicon. The first and second polymer coats each may be any one of polyimide, or BCB.

The present disclosure also provides a piezoelectric MEMS switch that includes a first metallic contact and a second metallic contact that is at a first end portion of a boom and spaced from the first contact. A cantilever is in mechanical communication with the boom. The cantilever extends above a space created by removal of a sacrificial material. The cantilever has a through-hole through which sacrificial material was removed from the space. The cantilever has an actuator of a layered structure that includes a piezoelectric layer disposed between a pair of electrode layers. The cantilever flexes when actuated so that the second contact reciprocates into electrical communication with the first contact. The first and second metallic contacts may be free of morphological change caused by exposure caused by exposure to such temperatures as required for annealing the piezoelectric layer of the cantilever or for high temperature deposition of the piezoelectric layer.

While at least one example embodiment of the MEMS devices has been presented in the foregoing detailed description, along with methods of making these, it should be appreciated that a vast number of variations exist. It should also be appreciated that the example embodiment or embodiments described herein are not intended to limit the scope, applicability, or configuration of the invention claimed here below in any way. Rather, the foregoing detailed description will provide those skilled in the art with a convenient road map for implementing the described embodiment or embodiments and variations thereof. These variations are within the scope of the appended claims and legal equivalents of elements of these claims. It should therefore be understood that various changes can be made in the function and arrangement of elements without departing from the scope of the invention as set forth in the appended claims.

What is claimed is:

1. A method of making a piezoelectric MEMS switch comprising:

forming a sacrificial layer on a substrate;

forming a first electrode layer over the substrate and the sacrificial layer;

forming an annealed piezoelectric dielectric layer over the first electrode layer;

forming a second electrode layer over the annealed piezoelectric layer, the second electrode layer cooperating with the first electrode layer and the annealed piezoelectric dielectric layer to form a piezoelectric actuator;

patterning the piezoelectric actuator to create a through-hole through which the sacrificial layer is exposed;

after forming the annealed piezoelectric dielectric layer, forming radio frequency signal lines adjacent the first and second electrode layers;

removing the sacrificial layer through the through-hole to create a void underlying the piezoelectric actuator;

forming a polymer coat over the piezoelectric actuator, the polymer coat extending through the through-hole and into the void to contact the substrate and define a polymeric finger supporting the piezoelectric actuator;

forming a contact in the polymer coat;

forming a boom mechanically coupling the piezoelectric actuator to the contact; and removing the polymer coat including the polymeric finger.

2. The method of claim 1, wherein the forming of the first electrode layer comprises depositing a metallic composition and patterning deposited metal.

3. The method of claim 1, wherein the forming the annealed piezoelectric dielectric layer comprises depositing, at high temperatures, a piezoelectric dielectric material in a layer.

4. The method of claim 1, wherein the forming the annealed piezoelectric dielectric layer comprises depositing a piezoelectric dielectric material layer and annealing the piezoelectric dielectric material layer at high temperatures.

5. The method of claim 1, wherein the forming of the second electrode layer comprises depositing a metallic composition and patterning the second electrode layer.

6. The method of claim 1, wherein the sacrificial layer comprises any of silicon dioxide, polysilicon and silicon oxynitride.

7. The method of claim 1, wherein the polymer coat comprises any of polyimide and BCB.

8. A method of making a piezoelectric MEMS switch comprising:

forming a sacrificial layer on a substrate;

forming a first electrode layer over the substrate and the sacrificial layer;

forming an annealed piezoelectric dielectric layer over the first electrode layer;

forming a second electrode layer over the annealed piezoelectric layer;

patterning the annealed piezoelectric to create a through-hole exposing the sacrificial layer;

forming radio frequency signal lines adjacent the first and second electrode layers after the forming of the annealed piezoelectric dielectric material layer;

forming a first polymer coat over the first electrode layer and the radio frequency signal lines;

removing the sacrificial layer through the through-hole;

forming a second polymer coat over the first polymer coat, the second polymer coat extending through the through-hole and contacting an upper surface of the substrate to support the annealed piezoelectric layer;

forming a contact in the second polymer coat after the forming of the annealed piezoelectric dielectric material layer;

patterning the second polymer coat to expose a portion of the second electrode layer;

depositing an upper dielectric layer over the exposed portion of second electrode layer and the contact so as to form a boom mechanically coupling the second electrode layer to the contact; and removing the first and second polymer coatings.

9. The method of claim 8, wherein the forming of an annealed piezoelectric layer comprises depositing, at high temperatures, a piezoelectric dielectric material in a layer.

10. The method of claim 8, wherein the forming of an annealed piezoelectric layer comprises depositing a piezoelectric dielectric material layer and annealing the layer at high temperatures.

11. The method of claim 8, further comprising applying heat and voltage across the piezoelectric layer to polarize the annealed piezoelectric layer.

12. The method of claim 8, wherein removing of the sacrificial layer comprises patterning and etching the first polymer coat to provide access to the sacrificial layer via a through-hole in the first polymer coat; and wet etching removal of sacrificial layer material through the through-hole.

13. The method of claim 8, wherein the sacrificial layer comprises silicon oxide, silicon oxynitride or polysilicon.

14. The method of claim 8, wherein the first and second polymer coats each comprises any one of polyimide, or BCB.

15. A method of fabricating a piezoelectric MEMS switch, comprising:

providing a base substrate;

forming a sacrificial layer on the substrate;

forming an annealed piezoelectric actuator on the base substrate and over the sacrificial layer;

patterning the annealed piezoelectric actuator to create a through-hole exposing the sacrificial layer;

after forming the annealed piezoelectric actuator, forming first and second radio frequency (RF) signal lines on the base substrate proximate the annealed piezoelectric actuator;

depositing a first polymeric coating over the first and second RF signal lines and over the annealed piezoelectric actuator;

removing the sacrificial layer through the through-hole to create a void underlying the piezoelectric actuator;

depositing a second polymeric coating over the piezoelectric actuator, the second polymeric coating extending through the through-hole and into the void to contact a surface of the substrate and define a supportive polymeric finger;

forming a contact on the second polymeric coating above the first and second RF signal lines;

forming a boom mechanically coupling the contact to the annealed piezoelectric actuator; and removing the first and second polymeric coatings including the supportive polymeric finger.

16. The method of claim 15 wherein the step of forming a boom comprises:

patterning the first and second polymeric coatings to expose the annealed piezoelectric actuator therethrough; and depositing an upper dielectric layer over the exposed portion of the piezoelectric actuator and the contact.

17. The method of claim 16 wherein the step of depositing an upper dielectric layer is performed such that the upper dielectric layer is disposed around but not over the through-hole.

18. The method of claim 15 wherein the step of depositing a first polymeric coating is performed such that the first polymeric coating at least partially fills the through-hole and contacts an upper surface of the sacrificial layer.

* * * * *